(12) United States Patent
Harada et al.

(10) Patent No.: US 6,380,881 B2
(45) Date of Patent: Apr. 30, 2002

(54) SUCCESSIVE APPROXIMATION A/D CONVERTER CAPABLE OF ERROR CORRECTION

(75) Inventors: Hisashi Harada; Takahiro Miki, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/757,462

(22) Filed: Jan. 11, 2001

(30) Foreign Application Priority Data

Jul. 4, 2000 (JP) ......................... 2000-202692

(51) Int. Cl.[7] .............. H03M 1/06; H03M 1/34
(52) U.S. Cl. .................... 341/165; 341/118
(58) Field of Search ............... 341/120, 156, 341/159, 165, 118, 161, 163, 172

(56) References Cited

U.S. PATENT DOCUMENTS 4,907,002 A * 3/1990 Kawada ................ 341/172
5,272,481 A * 12/1993 Sauer .................... 341/165
6,028,545 A * 2/2000 Chen .................... 341/156

OTHER PUBLICATIONS

"M16C/60 Group Data Sheet," Mitsubishi Electric Corporation, 1998, pp.1–5.

* cited by examiner

Primary Examiner—Patrick Wamsley
(74) Attorney, Agent, or Firm—Burns, Doane, Swecker & Mathis, LLP

(57) ABSTRACT

A successive approximation A/D converter includes a comparator formed of a plurality of comparators and comparing an analog input voltage with a plurality of voltages output from a digital-to-analog converter so as to output a conversion result including at least 2 bits. A control circuit in the A/D converter performs error correction based on the final result output from the comparator and outputs a final conversion result to a conversion result output terminal.

10 Claims, 10 Drawing Sheets

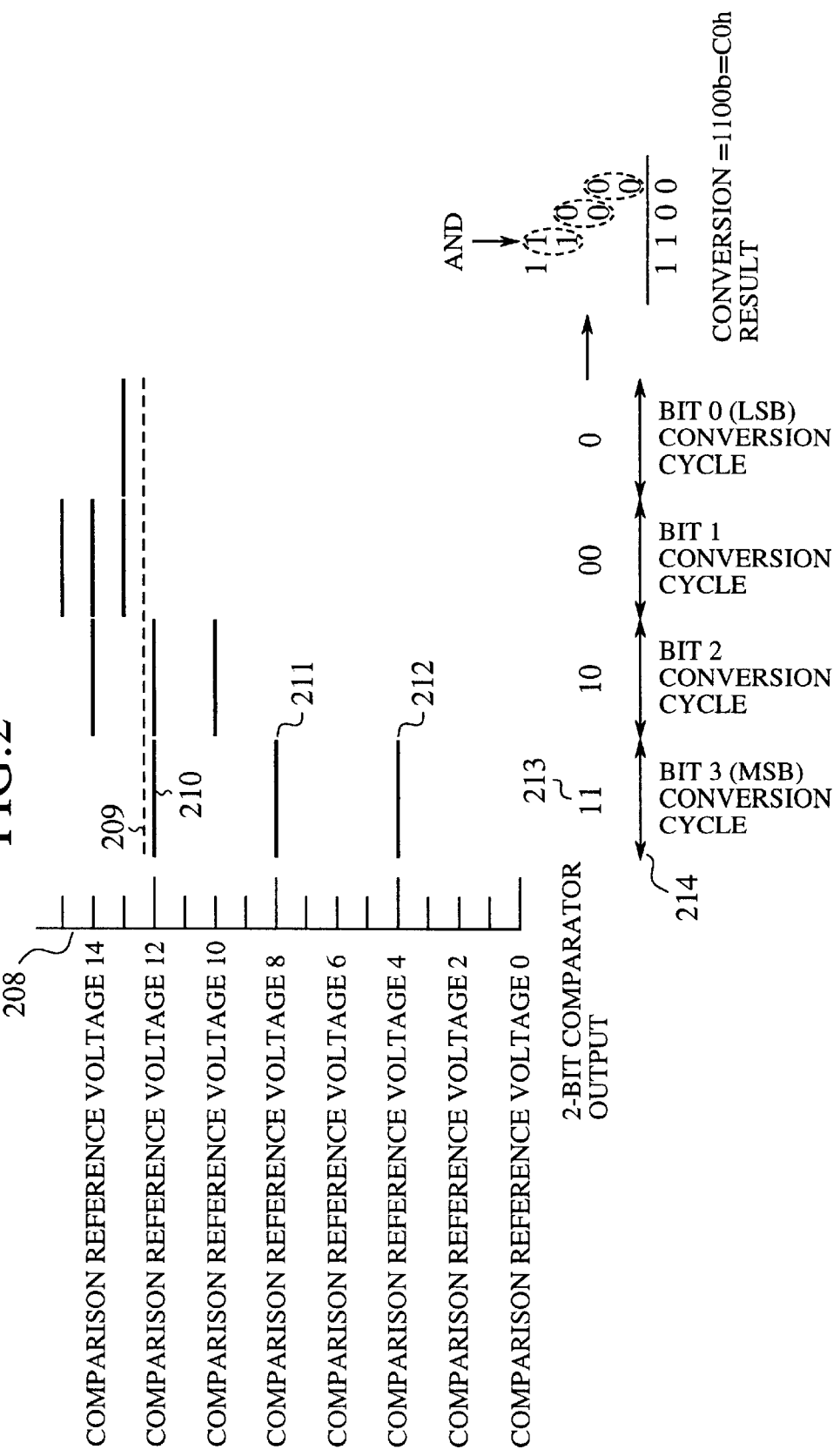

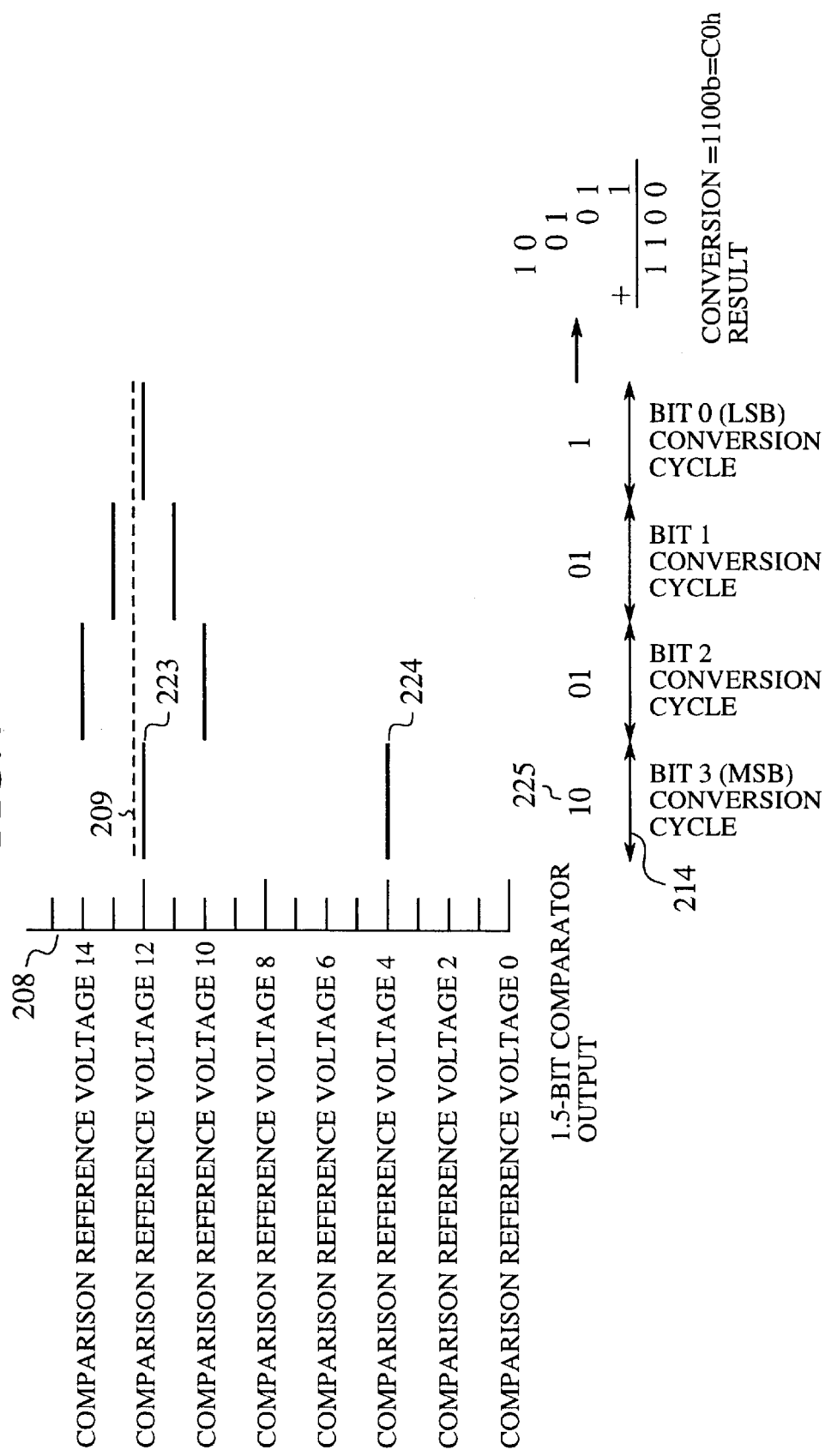

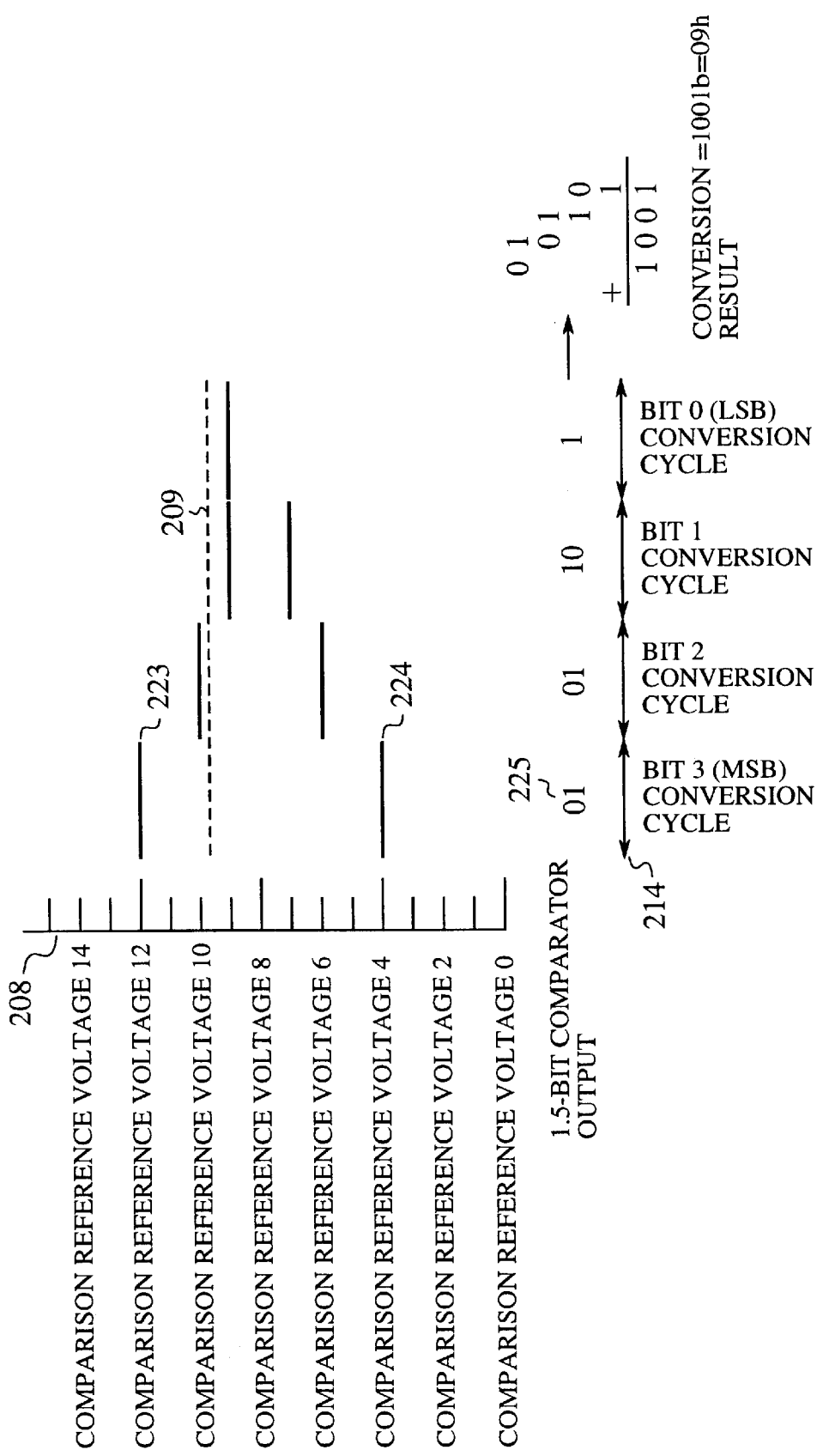

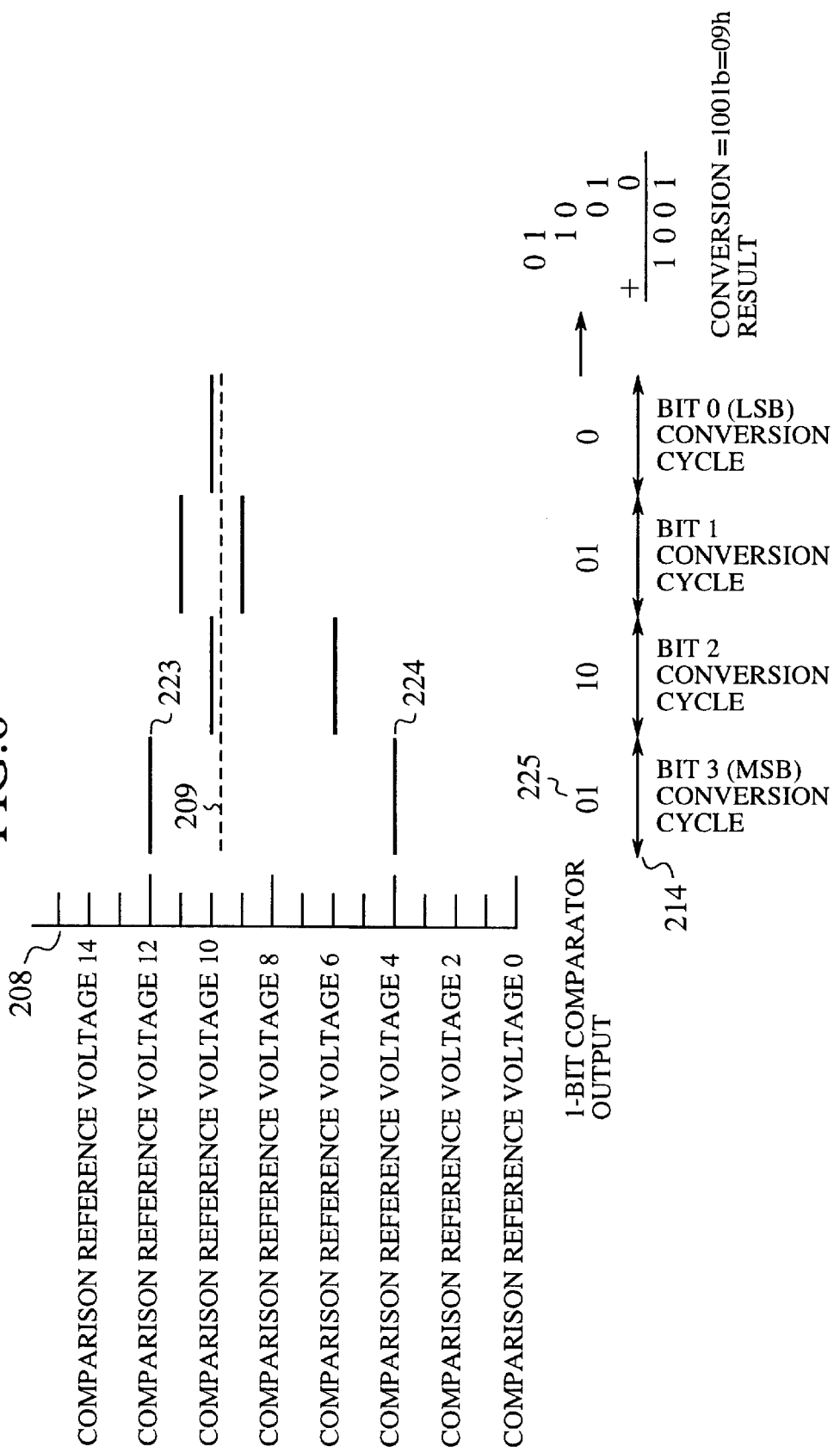

|  | | EXAMPLE OF VALIDATION RESULT OUTPUT A OK | EXAMPLE OF VALIDATION RESULT OUTPUT B NG |
|---|---|---|---|
| 12 | | 0 | 0 |
| 11 | | 0 | 0 |
| 10 | | 0 | 1 |
| 9 | ±4LSB VOLTAGES FOR COMPARISON FOR VALIDATION / REPEAT COMPARISONS IN THE ORDER OF INCREASING LEVELS OF VOLTAGE | 0 | 1 |
| 8 | | 1 | 1 |
| 7 | | 1 | 1 |
| 6 | | 1 | 1 |
| 5 | | 1 | 1 |
| 4 | | 1 | 1 |

SUCCESSIVE APPROXIMATION A/D CONVERTER CAPABLE OF ERROR CORRECTION

BACKGROUND OF THE INVENTION

1. Field of the Invention

The present invention generally relates to analog-to-digital converters and, more particularly, to a successive approximation analog-to-digital converter (hereinafter, referred to as a successive approximation A/D converter) capable of error correction. A successive approximation A/D converter is defined as an A/D converter effecting analog-to-digital conversion by determining a binary code bit by bit.

2. Description of the Related Art

A successive approximation A/D converter is well known in the art as an analog-to-digital converter for use in mechanical control such as servo control. FIG. 12 shows a construction of a 4-bit successive approximation A/D converter according to the related art. Referring to FIG. 12, the 4-bit successive approximation A/D converter comprises an analog input terminal 101, a conversion result output terminal 102, a sample and hold 103 (hereinafter, referred to as an S/H), a digital-to-analog converter 104 (hereinafter, referred to as a DAC), a ladder resistor (referred to as an SAR) 105, a 1-bit comparator 106 and a control circuit 107 provided with a latching function. The 1-bit comparator 106 is given its designation because it outputs a 1-bit conversion result to the control circuit 107 in one conversion cycle.

A description will now be given of the operation of each of the converter elements.

The S/H 103 having an input thereof connected to the analog input terminal 101 and an output thereof connected to the 1-bit comparator 106 holds an analog input voltage input via the analog input terminal 101 while the 1-bit comparator 106 is performing a comparison operation. The SAR 105 is comprised of a group of resistors for dividing an externally supplied or internally generated reference voltage in 16 steps ($2^4$=16) so as to output a voltage that serves as a reference in a comparison operation (hereinafter, simply referred to as a comparison reference voltage) to the DAC 104. The DAC 104 outputs to the 1-bit comparator 106 the comparison reference voltage produced by the SAR 105 or a comparison reference voltage produced on the basis of the comparison reference voltage produced by the SAR 105, in accordance with a control signal supplied from the control circuit 107. The 1-bit comparator 106 compares the analog input voltage held in the S/H 103 with the comparison reference voltage supplied from the DAC 104. The 1-bit comparator 106 converts a result of comparison into digital data so as to output the digital data to control circuit 107. The 1-bit comparator 106 outputs "1" as a conversion result when it is determined that the analog input voltage is higher than the comparison reference voltage and outputs "0" as a conversion result when it is determined that the analog input voltage is lower than the comparison reference voltage. The control circuit 107 latches the 1-bit conversion result output from the 1-bit comparator 206 and determines a voltage to be used as the comparison reference voltage in the subsequent comparison, based on the conversion result. The control circuit 107 outputs the control signal to the DAC 104 so as to set the determined voltage therein. When an entire conversion process is completed, the control circuit 107 outputs a final conversion result based on a 4-bit conversion result to the conversion result output terminal 102.

FIG. 13 shows a sequence of operations performed by the 4-bit successive approximation A/D converter according to the related art. A vertical scale 108 indicates 16 discrete values that the comparison reference voltage can take. A dotted line 109 indicates the analog input voltage. A solid line 110 indicates the comparison reference voltage subject to comparison with the analog input voltage by the 1-bit comparator 106. Binary values 111 indicate conversion results output in respective conversion cycles from the 1-bit comparator 106. Each of two-way arrows 112 indicates a conversion cycle.

A description will now be given of a sequence of a conversion operation.

In a bit 3 conversion cycle, voltage 8 is set by the SAR 105 and the DAC 104 as the comparison reference voltage. The level of voltage 8 is half that of an upper limit of the comparison reference voltage used in digital conversion of the analog input voltage. The 1-bit comparator 106 then compares the voltage 8 with the analog input voltage. Since the analog input voltage is higher in level than voltage 8, the 1-bit comparator 106 outputs "1" as the conversion result. The control circuit 107 latches the conversion result in the bit 3 conversion cycle and outputs the control signal to set the comparison reference voltage to be used in the subsequent comparison, based on the conversion result. If the conversion result in the bit 3 conversion cycle is "1", voltage 12 is set by the control signal. If the conversion result in the bit 3 conversion cycle is "0", voltage 4 is set by the control signal. Since, in this case, the conversion result output from the 1-bit comparator 106 is "1", voltage 12 is set as the comparison reference voltage in the subsequent comparison.

In a bit 2 conversion cycle, voltage 12 is set by the SAR 105 and the DAC 104 as the comparison reference voltage so that the 1-bit comparator 106 compares voltage 12 with the analog input voltage. Since the analog input voltage is higher in level than voltage 12, the 1-bit comparator 106 outputs "1" as the conversion result. The control circuit 107 latches the conversion result in the bit 2 conversion cycle and outputs the control signal to set the comparison reference voltage to be used in the subsequent comparison, based on the conversion result. That is, the control circuit 107 outputs the control signal to the DAC 104 to set the comparison reference voltage to be used in a bit 1 conversion cycle, based on the latched conversion result in the bit 3 conversion cycle and the latched conversion result in the bit 2 conversion cycle. Assuming that the conversion result in the bit 3 conversion cycle is "1", if the conversion result in the bit 2 conversion cycle is "1", voltage 14 is set by the control signal; if the conversion result in the bit 2 conversion cycle is "0", voltage 10 is set by the control signal. Since, in this case, the conversion result in the bit 2 conversion cycle is "1", voltage 14 is set as the comparison reference voltage to be used in the subsequent comparison.

In the bit 1 conversion cycle, voltage 14 is set by the SAR 105 and the DAC 104 as the comparison reference voltage so that the 1-bit comparator 106 compares voltage 14 with the analog input voltage. Since the analog input voltage is lower in level than voltage 14, the 1-bit comparator 106 outputs "0", as the conversion result. The control circuit 107 latches the conversion result in the bit 1 conversion cycle and outputs the control signal to set the comparison reference voltage to be used in the subsequent comparison, based on the conversion result. That is, the control circuit 107 outputs the control signal to the DAC 104 to set the comparison reference voltage to be used in bit 0 conversion cycle, based on the latched conversion result in the bit 3 conversion cycle, the latched conversion result in the bit 2 conversion cycle and the latched conversion result in the bit 1 conversion cycle. Assuming that the conversion result in the bit 3 conversion cycle is "1" and the conversion result in the bit 2 conversion cycle is "1", if the conversion result in the bit 1 conversion cycle is "1", voltage 15 is set by the control signal; if the conversion result in the bit 1 conversion cycle is "0", voltage 13 is set by the control signal. Since, in this case, the conversion result in the bit 1 conversion cycle is "0", voltage 13 is set as the comparison reference voltage to be used in the subsequent comparison.

Finally, in the bit 0 conversion cycle, the SAR 105 and the DAC 104 sets voltage 13 as the comparison reference voltage so that the 1-bit comparator 106 compares the comparison reference voltage with the analog input voltage. Since the analog input voltage is lower in level than voltage 13, the 1-bit comparator 106 outputs "0" as the conversion result. The control circuit 107 latches the conversion result in the bit 0 conversion cycle before completing the entire conversion process. An externally supplied control signal causes the final 4-bit conversion result to be output via the conversion result output terminal 12.

A disadvantage of the successive approximation A/D converter according to the related art is that the 1-bit conversion result yielded in each conversion cycle is output without being subjected to error detection. Since error correction adapted to incorrect conversion caused by cross talk, power source noise and the like is not provided, the converter according to the related art cannot adapt to high precision performance.

SUMMARY OF THE INVENTION

Accordingly, a general object of the present invention is to provide a successive approximation A/D converter in which the aforementioned disadvantage is eliminated.

Another and more specific object of the invention is to provide a successive approximation A/D converter capable of high precision performance in which an incorrect conversion is corrected.

The aforementioned objects can be achieved by a successive approximation A/D converter comprising an analog input terminal; a conversion result output terminal; voltage holding means connected to the analog input terminal and holding an analog input voltage input via the analog input terminal; voltage generating means for generating one or a plurality of voltages that serve as sources for producing comparison reference voltages subject to comparison with the analog input voltage; comparison reference voltage outputting means connected to the voltage generating means and outputting one or a plurality of comparison reference voltages in accordance with a control signal; comparing means comprising one or a plurality of comparators and comparing the analog input voltage with the one or the plurality of voltages output by the comparison reference voltage outputting means, so as to output a conversion result comprising at least 2 bits; and control means effecting error correction based on the conversion result output by the comparing means so as to output a final conversion result to the conversion result output terminal.

The comparing means may compare a first comparison reference voltage, a second comparison reference voltage lower than the first comparison reference voltage, a third comparison reference voltage with the analog input voltage, so as to output the conversion result "11" when the analog input voltage is higher than the first comparison reference voltage, output the conversion result "10" when the analog input voltage is lower than the first comparison reference voltage and higher than the second comparison reference voltage, output the conversion result "01" when the analog input voltage is lower than the second comparison voltage and higher than the third comparison reference voltage, output the conversion result "00" when the analog input voltage is lower than the third comparison reference voltage, output the conversion result "1" when the analog input voltage is higher than the first comparison reference voltage, where the first comparison reference voltage is the only voltage subject to comparison, and output the conversion result "0" when the analog input voltage is lower than the first comparison reference voltage, where the first comparison reference voltage is the only voltage subject to comparison, and the control means may process conversion of the analog input voltage into a n-bit digital value through cycles, where the comparison reference voltage is given in $2^n$ steps, by outputting the control signal to the comparison reference voltage outputting means, thereby a) in a first conversion cycle, setting the first comparison reference voltage at a step $1*2^{n-2}$, setting the second comparison reference voltage at a step $2*2^{n-2}$, setting the third comparison reference voltage at a step $3*2^{n-2}$, b) in an ith conversion cycle, where i=2~n-1, setting the first comparison reference voltage in a previous conversion cycle as the second comparison reference voltage when the conversion result in the previous conversion cycle is one of "11" and "10"; setting the third comparison reference voltage in the previous conversion cycle as the second comparison reference voltage, setting a sum of the second comparison reference voltage in the previous conversion cycle and an increment of $2^{n-i-1}$ in step as the first comparison reference voltage, and setting the second comparison reference voltage with a decrement of $2^{n-i-1}$ in step subtracted therefrom as the third comparison reference voltage, when the conversion result in the previous conversion cycle is one of "01" and "00", c) in a final nth conversion cycle, setting the first comparison reference voltage in the previous conversion cycle as the first comparison reference voltage, when the conversion result in the previous conversion cycle is one of "11" and "10"; setting the third comparison reference voltage in the previous conversion cycle as the first comparison conversion cycle, when the conversion result in the previous conversion cycle is one of "01" and "00".

The comparing means may compare a first comparison reference voltage output from the comparison reference voltage outputting means and a second comparison reference voltage lower than the first comparison reference voltage also output from the comparison reference voltage outputting means with the analog input voltage, thereby outputting the conversion result "10" when the analog input voltage is higher than the first comparison reference voltage, outputting "01" when the analog input voltage is lower than the first comparison reference voltage and higher than the second comparison reference voltage, outputting "00" when the analog input voltage is lower than the second comparison reference voltage, outputting the conversion result "1" when the analog input voltage is higher than the first comparison reference voltage, where the first comparison reference voltage is the only voltage subject to comparison, and outputting "0" when the analog input voltage is lower than the first comparison reference voltage, where the first comparison reference voltage is the only voltage subject to comparison, and wherein the control means may process conversion of the analog input voltage into a n-bit digital value through cycles, where the comparison reference voltage is given in $2^n$ steps, by outputting the control signal to the comparison reference voltage outputting means, thereby a) in a first conversion cycle, setting the first comparison reference voltage at a step $1*2^{n-2}$ and setting the second comparison reference voltage at a step $3*2^{n-2}$, b) in an ith conversion cycle, where i=2~n−1, setting a sum of the first comparison reference voltage in a previous conversion cycle and an increment of $2^{n-i-1}$ in step as the first comparison reference voltage, setting the first comparison reference voltage with a decrement of $2^{n-i-1}$ in step subtracted therefrom as the second comparison reference voltage, when the conversion result in the previous conversion cycle is "10"; setting the first comparison reference voltage in the previous conversion cycle with a decrement of $2^{n-i-1}$ in step subtracted therefrom as the first comparison reference voltage, setting a sum of the second comparison reference voltage in the previous conversion cycle and an increment of $2^{n-i-1}$ in step as the second comparison reference voltage, when the conversion result in the previous conversion cycle is "01"; setting a sum of the second comparison reference voltage in the previous conversion cycle and an increment of $2^{n-i-1}$ in step as the first comparison reference voltage, setting the second comparison reference voltage in the previous conversion cycle with a decrement of $2^{n-i-1}$ in step subtracted therefrom as the second comparison reference voltage, when the conversion result in the previous conversion cycle is "00", c) in a final nth conversion cycle, setting the first comparison reference voltage in the previous conversion cycle as the first comparison reference voltage, when the conversion result in the previous conversion cycle is "10"; setting the first comparison reference voltage in the previous conversion cycle with a decrement of 1 subtracted therefrom as the first comparison conversion cycle, when the conversion result in the previous conversion cycle is "01"; and setting the second comparison reference voltage in the previous conversion cycle as the first comparison reference voltage when the conversion result in the previous conversion cycle is "00".

The comparing means may be comprised of one comparator.

The comparing means may be comprised of one comparator.

The successive approximation A/D converter may further comprise re-conversion means wherein, in the ith (i=1~n−2) conversion cycle comprising the cycles for conversion of the analog input voltage into the n-bit digital value, a lower bit from the conversion result of the ith conversion cycle is compared with a higher bit from the conversion result in the conversion cycle subsequent to the ith conversion cycle so that, if the compared bits do not match, each of the ith conversion cycle and the subsequent conversion cycle is repeated at least once, a lower bit from the conversion result in the n−1th conversion cycle is compared with a bit from the conversion result in the nth conversion cycle so that, if the compared bits do not mach, each of the n−1th conversion cycle and the nth conversion cycle is repeated at least once.

The successive approximation A/D converter may further comprise conversion result validation means for determining a reference voltage corresponding to the digital value representing a final result of conversion, setting a predetermined range of voltages centered about the reference voltage, and determining whether the final result of conversion is valid based on comparison of voltages in the range with the analog input voltage.

The conversion result validating means may perform comparison in an increasing order of voltage levels for the voltages higher than the reference voltage and then performs comparison in a decreasing order for the voltages lower than the reference voltage.

The conversion result validating means may first perform comparison using the reference voltage and then alternately uses a higher voltage higher than the reference voltage and a lower voltage lower than the reference voltage in comparison in an increasing order of distance from the reference voltage.

The conversion result validating means may set an order of comparing voltages in the range with the analog input voltage, in accordance with a binary search scheme.

BRIEF DESCRIPTION OF THE DRAWINGS

Other objects and further features of the present invention will be apparent from the following detailed description when read in conjunction with the accompanying drawings, in which:

FIG. 2 shows a sequence of operations of a successive approximation A/D converter according to the first embodiment;

FIG. 4 shows a sequence of operations of the successive approximation A/D converter according to the second embodiment;

FIG. 5 shows a sequence of operations of the successive approximation A/D converter according to the second embodiment in a normal operation;

FIG. 6 shows a sequence of operations of the successive approximation A/D converter according to the second embodiment when an error occurs;

DETAILED DESCRIPTION OF THE PREFERRED EMBODIMENTS

Figure 1:
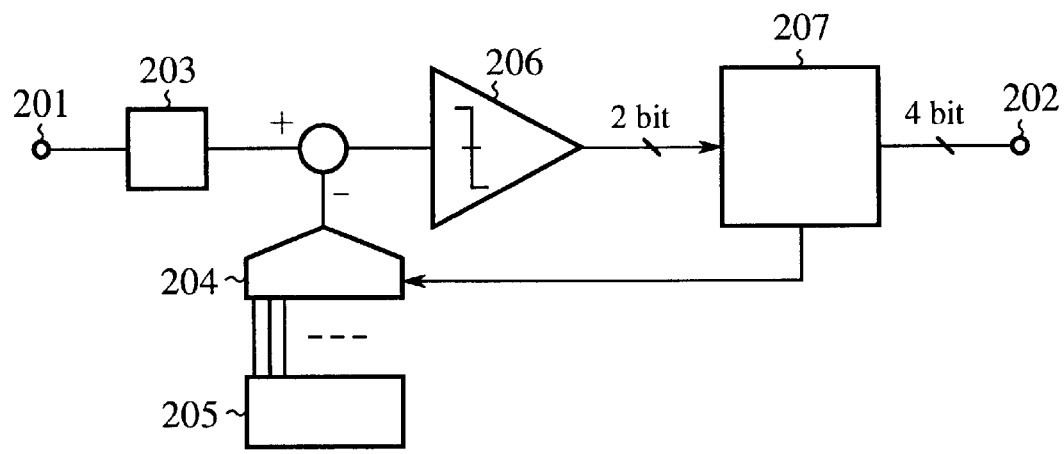
FIG. 1 shows a construction of a successive approximation A/D converter according to a first embodiment of the present invention.

FIG. 1 shows a construction of a successive approximation A/D converter according to a first embodiment of the present invention. Referring to FIG. 1, the successive approximation A/D converter comprises an analog input terminal 201, a conversion result output terminal 202, a sample and hold (hereinafter, simply referred to as S/H) (voltage holding means), a digital-to-analog converter 204 (hereinafter, simply referred to as DAC) (comparison reference voltage outputting means), a ladder resistor 205 (hereinafter, simply referred to as an SAR) (comparison reference voltage generating means), a 2-bit comparator 206 (comparing means) consisting of three comparators and a control circuit 207 (control means) provided with latching and error correction functions. The 2-bit comparator 6 is given its designation because it outputs a conversion result in the form of 2-bit identification information ("00", "01", "10" or "11") to the control circuit 107 in one conversion cycle.

A description will now be given of the operation of the converter elements.

The S/H 203 having an input thereof connected to the analog input terminal 201 and an output thereof connected to the 2-bit comparator 206 holds an analog input voltage input via the analog input terminal 201 while the 2-bit comparator 206 is performing a comparison operation. The SAR 205 is comprised of a group of resistors for dividing an externally supplied or internally generated reference voltage in 16 steps. ($2^4=16$) so as to output a voltage that serves as a reference in a comparison operation (hereinafter, simply referred to as a comparison reference voltage) to the DAC 204. The DAC 204 outputs to the 2-bit comparator 206 the comparison reference voltage produced by the SAR 205 or a comparison reference voltage produced on the basis of the comparison reference voltage produced by the SAR 205, in accordance with a control signal supplied from the control circuit 207. The 2-bit comparator 206 compares the analog input voltage held in the S/H 203 with three comparison reference voltages supplied from the DAC 204. The 2-bit comparator 206 converts a result of comparison into 2-bit digital data so as to output the digital data to control circuit 207. If it is determined, as a result of comparison between the three comparison reference voltages and the analog input voltage, that the analog input voltage is higher in level than the highest comparison reference voltage, the 2-bit comparator 206 outputs a conversion result "11b". If the analog input voltage is lower in level than the highest comparison reference voltage but higher than the intermediate comparison reference voltage, the 2-bit comparator 206 outputs a conversion result "10b". If the analog input voltage is lower in level than the intermediate comparison reference voltage but higher than the lowest comparison reference voltage, the 2-bit comparator 206 outputs a conversion result "01b". If the analog input voltage is lower in level than the lowest comparison reference voltage, the 2-bit comparator 206 outputs a conversion result "00b". The control circuit 207 latches the 2-bit conversion result output from the 2-bit comparator 206 and determines three comparison reference voltages to be used in the subsequent conversion cycle, based on the conversion result. The control circuit 207 then outputs the control signal to the DAC 204 to set the three comparison reference voltages. The control circuit 207 performs error correction using redundant bits in the 2-bit conversion results obtained in the respective conversion cycles. A detailed description of the error correction will be given later. When an entire conversion process is completed, the control circuit 207 outputs a final conversion result based on the conversion results of the respective conversion cycles to the conversion result output terminal 202.

FIG. 2 shows a sequence of operations performed by the successive approximation A/D converter according to the first embodiment. A vertical scale 208 indicates 16 discrete values that the comparison reference voltage can take. A dotted line 209 indicates the analog input voltage. A solid line 210 indicates the highest comparison reference voltage (hereinafter, referred to as a comparison reference voltage A) subject to comparison with the analog input voltage by the 2-bit comparator 206. A solid line 211 indicates the intermediate comparison reference voltage (hereinafter, referred to as a comparison reference voltage B) subject to comparison with the analog input voltage by the 2-bit comparator 206. A solid line 212 indicates the lowest comparison reference voltage (hereinafter, referred to as a comparison reference voltage C) subject to comparison with the analog input voltage by the 2-bit comparator 206. 2-bit binary values 213 indicate conversion results output in respective conversion cycles from the 2-bit comparator 206. Each of two-way arrows 214 indicates a conversion cycle.

A description will now be given of the sequence of operations. A comparison reference voltage setting algorithm adapted to a general case in which the analog input voltage is converted into an n-bit digital value will first be described.

In the first conversion cycle, a comparison reference voltage at step $1*2^{n-2}$ (hereinafter, simply referred to as voltage $1*2^{n-2}$), included in a range of $2^n$ discrete voltage levels shown in FIG. 2 that the comparison reference voltage could assume, is used as the comparison reference voltage C. Likewise, a comparison reference voltage $2*2^{n-2}$ is used as the comparison reference voltage B; and a comparison reference voltage $3*2^{n-2}$ is used as the comparison reference voltage A.

In a subsequent ith conversion cycle (i=2~n-1), the comparison reference voltage A in the previous comparison is used as the comparison reference voltage B when the conversion result yielded in the previous conversion cycle is "11" or "10". When the conversion result in the previous conversion cycle is "01" or "00", the comparison reference voltage C in the previous comparison is used as the comparison reference voltage B, a sum of the comparison reference voltage B thus set and an increment of $2^{n-i-1}$ is used as the comparison reference voltage A, and the comparison reference voltage B with a decrement of $2^{n-i-1}$ subtracted therefrom is used as the comparison reference voltage C. Throughout the rest of the specification, the level of voltage will be designated with reference to one of the $2^n$ steps described above.

In the last conversion cycle, when the conversion result yielded in the previous conversion cycle is "11"or "10", the comparison reference voltage A in the previous conversion cycle is used as the comparison reference voltage used in the last conversion cycle. When the conversion result yielded in the previous conversion cycle is "01" or "00", the comparison reference voltage C in the previous conversion cycle is used as the comparison reference voltage in the last conversion cycle.

By configuring the comparison reference voltage setting algorithm as described above, it is ensured that the lower bit from the 2-bit conversion result yielded in the previous conversion cycle matches the higher bit (in the case of the last conversion cycle, the only bit yielded as a result of comparison) from the 2-bit conversion result yielded in the current conversion cycle, unless an error in conversion occurs. That is, error detection is possible by comparing the lower bit from the conversion result in the previous conversion cycle with the higher bit from the conversion result yielded in the current conversion cycle.

A description will now be given of a comparison reference voltage setting algorithm adapted to 4-bit data output for use in the 4-bit output successive approximation A/D converter according to the first embodiment. In order to differentiate between comparison reference voltages used in the respective conversion cycles, the comparison reference voltages in a bit i conversion cycle will be denoted as voltages Ai, Bi and Ci.

In a bit 3 conversion cycle, voltage 12 is used as a comparison reference voltage A3, voltage 8 is used as a comparison reference voltage B3 and voltage 4 is used as a comparison reference voltage C3.

In a bit 2 conversion cycle, if the conversion result in the bit 3 conversion cycle is "11" or "10", the comparison reference voltage A3 (=voltage 12) is used as the comparison reference voltage B2, voltage 14 (=12(B2)+2) is used as the comparison reference voltage A2 and voltage 10 (=12(B2)−2) is used as the comparison reference voltage C2. If the conversion result in the bit 3 conversion cycle is "01" or "00", the comparison reference voltage C3 (=voltage 4) is used as the comparison reference voltage B2, voltage 6 (=4(B2)+2) is used as the comparison reference voltage A2 and voltage 2 (=4(B2)−2) is used as the comparison reference voltage C2.

In a bit 1 conversion cycle, if the conversion result in the bit 2 conversion cycle is "11" or "10", the comparison reference voltage A2 is used as the comparison reference voltage B1, voltage (B1+1) is used as the comparison reference voltage A1 and voltage (B1−1) is used as the comparison reference voltage C1. If the conversion result in the bit 2 conversion cycle is "01" or "00", the comparison reference voltage C2 is used as the comparison reference voltage B1, voltage (B1+1) is used as the comparison reference voltage A1 and voltage (B1−1) is used as the comparison reference voltage C1.

In a bit 0 conversion cycle, if the conversion result in the bit 1 conversion cycle is "11" or "10", the comparison reference voltage A1 is used as the comparison reference voltage in the bit 0 conversion cycle. If the conversion result in the bit 1 conversion cycle is "01" or "00", the comparison reference voltage C1 is used as the comparison reference voltage in the bit 0 conversion cycle.

A specific description of the comparison operation sequence will be given with reference to an example shown in FIG. 2.

In the bit 3 conversion cycle, the control signal is output to the DAC 204 to set voltage 12 as the comparison reference voltage A3, voltage 8 as the comparison reference voltage B3 and voltage 4 as the comparison reference voltage C3 so that the 2-bit comparator 206 compares these voltages with the analog input voltage. In this case, since the analog input voltage is higher in level than the comparison reference voltage A3, the comparison reference voltage B3 and the comparison reference voltage C3, the 2-bit comparator 206 outputs a conversion result "11b". The control circuit 207 then latches the conversion result in the bit 3 conversion cycle and outputs, based on the conversion result, the control signal to the DAC 204 so as to set voltage 14 as the comparison reference voltage A2 used in the bit 2 conversion cycle, set voltage 12 as the comparison reference voltage B2 and set voltage 10 as the comparison reference voltage C2.

In the bit 2 conversion cycle, the 2-bit comparator 206 compares the three comparison reference voltages thus set with the analog input voltage. In this case, since the analog input voltage is lower in level than the comparison reference voltage A2 and higher than the comparison reference voltage B2 and the comparison reference voltage C2, the 2-bit comparator 206 outputs a conversion result "10b". The control circuit 207 latches the conversion result in the bit 2 conversion cycle and outputs, based on the conversion result, the control signal to the DAC 204 so as to set voltage 15 as the comparison reference voltage A1 used in the bit 1 conversion cycle, set voltage 14 as the comparison reference voltage B1 and set voltage 13 as the comparison reference voltage C1.

In the bit 1 conversion cycle, the 2-bit comparator 206 compares the three comparison reference voltages thus set with the analog input voltage. In this case, since the analog input voltage is lower in level than the comparison reference voltage A1, the comparison reference voltage B1 and the comparison reference voltage C1, the 2-bit comparator 206 outputs a conversion result "00b". The control circuit 207 latches the conversion result in the bit 1 conversion cycle and outputs, based on the conversion result, the control signal to the DAC 204 so as to set voltage 3 as the comparison reference voltage used in the bit 0 conversion cycle.

In the bit 0 conversion cycle, one of the three comparators constituting the 2-bit comparator 206 is used to compare voltage 13 with the analog input voltage. In this case, since the analog input voltage is lower in level than voltage 13, the 2-bit comparator 206 outputs a conversion result "0b". The control circuit 207 latches the conversion result in the bit 0 conversion cycle and completes the entire conversion process. Based on the conversion results in the respective conversion cycles, the control circuit 207 generates a final conversion result which provides for error correction.

The final conversion result in the n-bit digital conversion of the analog input voltage, which result also provides for error correction, is generated such that the 2-bit conversion result obtained in the ith conversion cycle (i=1~n−2) is shifted by n−i−1 bits to the left. The conversion results from the respective conversion cycles thus shifted are ANDed. In the example shown in FIG. 2, the conversion result obtained in the bit 3 conversion cycle is shifted by 2 bits to the left and the conversion result obtained in the bit 2 conversion cycle is shifted by 1 bit to the left. Thereafter, the conversion results from the respective conversion cycles are ANDed so that the final conversion result is generated.

Error correction of the bit 2 data is performed by ANDing the lower bit of the conversion result obtained in the bit 3 conversion cycle and the higher bit of the conversion result obtained in the bit 2 conversion cycle. Error correction of the bit 1 data is performed by ANDing the lower bit of the conversion result obtained in the bit 2 conversion cycle and the higher bit of the conversion result obtained in the bit 1 conversion cycle. Error correction of the bit 0 data is performed by ANDing the lower bit of the conversion result obtained in the bit 1 conversion cycle and the bit resulting from the conversion in the bit 0 conversion cycle. The error correction thus described is effective for an error in conversion caused by cross talk, noise, offset difference of the comparator, distortion in the comparison reference voltage or the like and resulting in, for example, a conversion result "1" when the conversion result "0" is due. The 4-bit final conversion corrected for error is read via the conversion result output terminal 202 in response to an externally supplied control signal.

While it is assumed that the corresponding bits are ANDed for error correction according to the first embodiment, it is also possible to OR the corresponding bits for error correction. The error correction based on the OR operation is effective for an error in conversion caused by cross talk, noise or the like and resulting, for example, a conversion result "0" when the conversion result "1" is due.

In the successive approximation A/D converter according to the first embodiment, 16 discrete levels of the comparison reference voltage are provided since the 4-bit digital output is assumed. The A/D converter according to the first embodiment is equally applicable to the A/D converter outputting fewer than 4 bits or more than 5 bits. In this case, the generic comparison reference voltage setting algorithm is applied.

As has been described, according to the first embodiment, the 2-bit comparator 206 compares the comparison reference voltage A, the comparison reference voltage B and the comparison reference voltage C with the analog input voltage and outputs "11", "10", "01" or "00" based on the result of conversion. The control circuit 207 outputs the control signal so as to set the comparison reference voltage A, the comparison reference voltage B and the comparison reference voltage C in the subsequent conversion cycle, based on the conversion result in the previous conversion cycle. It is thus ensured that the lower bit of the 2-bit conversion result in the previous conversion cycle matches the higher bit of the 2-bit conversion result in the current conversion cycle. By comparing the corresponding bits, an error is properly detected. The 2-bit conversion result obtained by the successive approximation n-bit output A/D converter in the jth conversion cycle (J=1~n-2) may be shifted by n-j-1 bits to the left. By ANDing or ORing the conversion results from the respective conversion cycles thus shifted, any error occurring in the converter can be corrected as the final conversion result is generated. Accordingly, a high-precision A/D converter is provided.

Second Embodiment

Figure 3:
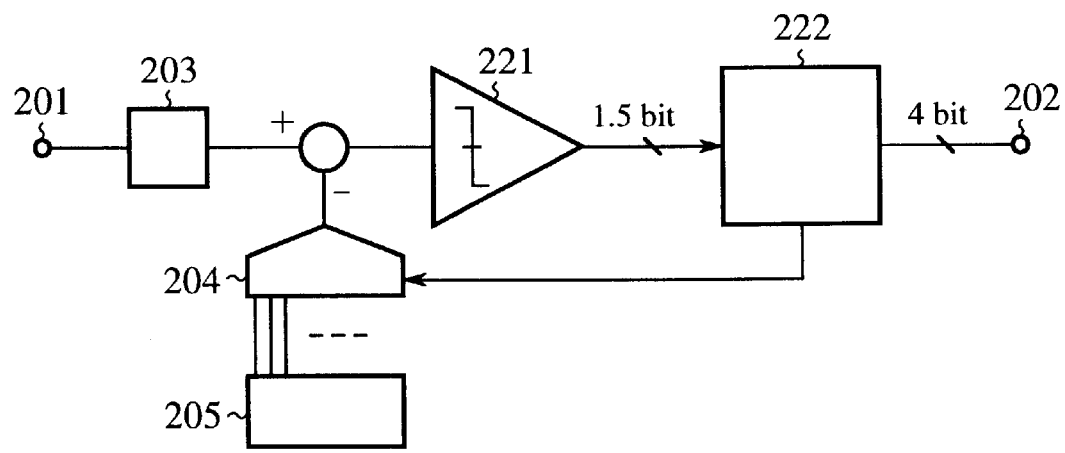
FIG. 3 shows a construction of a successive approximation A/D converter according to a second embodiment of the present invention.

FIG. 3 shows a construction of a successive approximation A/D converter according to a second embodiment of the present invention. Referring to FIG. 3, those elements that are identical or equivalent to the corresponding elements of FIG. 1 are designated by the same reference numerals and the description thereof is omitted. The Reference numeral 221 indicates a 1.5-bit comparator (comparing means) comprised of two comparators, and 222 indicates a control circuit (control means) provided with latch and error correction functions. The 1.5-bit comparator 221 is given its designation because it outputs a conversion result in the form of 1.5-bit identification information ("00", "01" or "10") to the control circuit 222 in one conversion cycle.

A description will now be given of the operation of the converter elements.

The S/H 203 having an input thereof connected to the analog input terminal 201 and an output thereof connected to the 1.5-bit comparator 221 holds an analog input voltage input via the analog input terminal 201 while the 1.5-bit comparator 221 is performing a comparison operation. The SAR 205 is comprised of a group of resistors for dividing an externally supplied or internally generated reference voltage in 16 steps ($2^4$=16) so as to output a comparison reference voltage to the DAC 204. The DAC 204 outputs to the 1.5-bit comparator 221 the comparison reference voltage produced by the SAR 205 or a comparison reference voltage produced on the basis of the comparison reference voltage produced by the SAR 205, in accordance with a control signal supplied from the control circuit 222. The 1.5-bit comparator 221 compares the analog input voltage held in the S/H 203 with two comparison reference voltages supplied from the DAC 204. The 1.5-bit comparator 221 converts a result of comparison into 2-bit digital data so as to output the digital data to control circuit 222. If it is determined, as a result of comparison between the two comparison reference voltages and the analog input voltage, that the analog input voltage is higher in level than the higher comparison reference voltage, the 1.5-bit comparator 221 outputs a conversion result "10b". If the analog input voltage is lower in level than the higher comparison reference voltage but higher than the lower comparison reference voltage, the 1.5-bit comparator 222 outputs a conversion result "01b". If the analog input voltage is lower in level than the lower comparison reference voltage, the 1.5-bit comparator 221 outputs a conversion result "00b". The control circuit 222 latches the 2-bit conversion result output from the 1.5-bit comparator 221 and determines two comparison reference voltages to be used in the subsequent conversion cycle, based on the conversion result. The control circuit 222 then outputs the control signal to the DAC 204 to set the two comparison reference voltages. The control circuit 222 generates a final conversion result which provides for error correction using redundant bits in the 2-bit conversion results obtained in the respective conversion cycles. A detailed description of generation of the final result and error correction will be given later.

FIG. 4 shows a sequence of operations performed by the successive approximation A/D converter according to the second embodiment. Referring to FIG. 4, those elements that are identical or equivalent to the corresponding elements of FIG. 2 are designated by the same numerals and the description thereof is omitted. A solid line 223 indicates the higher comparison reference voltage (hereinafter, referred to as the comparison reference voltage D) (first comparison reference voltage) subject to comparison with the analog input voltage by the 1.5-bit comparator 221. A solid line 224 indicates the lower comparison reference voltage (hereinafter, referred to as the comparison reference voltage E) (second comparison reference voltage) subject to comparison with the analog input voltage by the 1.5-bit comparator 221. 2-bit binary values 225 indicate conversion results output in respective conversion cycles from the 1.5-bit comparator 221.

A description will be given of the operation sequence. A comparison reference voltage setting algorithm adapted to a general case in which the analog input voltage is converted into an n-bit digital value will first be described.

In the first conversion cycle, a comparison reference voltage $3*2^{n-2}$, included in a range of $2^n$ discrete voltage levels that the comparison reference voltage could assume, is used as the comparison reference voltage D. Likewise, a comparison reference voltage $1*2^{n-2}$ is used as the comparison reference voltage B.

In a subsequent ith conversion cycle (i=2~n-1), a sum of the comparison reference voltage D in the previous conversion cycle and an increment of $2^{n-i-1}$ is used as the comparison reference voltage D when the conversion result yielded in the previous conversion cycle is "10", and the previous comparison reference voltage D with a decrement of $2^{n-i-1}$ subtracted therefrom is used as the comparison reference voltage E. When the conversion result yielded in the previous conversion cycle is "01", the previous comparison reference voltage D with a decrement of $2^{n-i-1}$ subtracted therefrom is used as the comparison reference voltage D, and a sum of the previous comparison reference voltage E and an increment of $2^{n-i-1}$ is used as the comparison reference voltage E. When the conversion result yielded in the previous conversion cycle is "00", a sum of the previous comparison reference voltage E and an increment of $2^{n-i-1}$ is used as the comparison reference voltage D, and the previous comparison reference voltage E with a decrement of $2^{n-i-1}$ subtracted therefrom is used as the comparison reference voltage E.

In the last conversion cycle when the conversion result yielded in the previous conversion cycle is "10", the comparison reference voltage D in the previous conversion cycle is used as the comparison reference voltage used in the last conversion cycle. When the conversion result yielded in the conversion cycle preceding the last conversion cycle is "01", the previous comparison reference voltage D with a decrement of 1 subtracted therefrom is used as the comparison preference voltage. When conversion result yielded in the conversion cycle preceding the last conversion cycle is "00", the previous comparison reference voltage E is used as the comparison reference voltage.

By configuring the comparison reference voltage setting algorithm as described above, by shifting the 2-bit conversion result yielded by the n-bit output successive approximation A/D converter in the ith conversion cycle (i=1n−2) by n−i−1 bits to the left, and by ANDing the conversion results in the conversion cycles thus shifted, it is ensured that the final conversion result thus generated also provides for error correction.

A description will now be given of a comparison reference voltage setting algorithm adapted to 4-bit data output for use in the 4-bit output successive approximation A/D converter according to the second embodiment. In order to differentiate between comparison reference voltages used in the respective conversion cycles, the comparison reference voltages in a bit i conversion cycle will be denoted as voltages Di and Ei.

In a bit 3 conversion cycle, voltage 12 is used as a comparison reference voltage D3 and voltage 4 is used as a comparison reference voltage E3.

In a bit 2 conversion cycle, if the conversion result in the bit 3 conversion cycle is "10", a sum of the comparison reference voltage D3 and an increment of 2 (D3+2=voltage 14) is used as the comparison reference voltage D2, and the comparison reference voltage D3 with a decrement of 2 subtracted therefrom (D3−2=voltage 10) is used as the comparison reference voltage E2. If the conversion result in the bit 3 conversion cycle is "01", the comparison reference voltage D3 with a decrement of 2 subtracted therefrom (D3−2=voltage 10) is used as the comparison reference voltage D2, and a sum of the comparison reference voltage E3 and an increment of 2 (E3+2=voltage 6) is used as the comparison reference voltage E2. If the conversion result in the bit 3 conversion cycle is "00", a sum of the comparison reference voltage E3 and an increment of 2 (E3+2=voltage 6) is used as the comparison reference voltage D2, and the comparison reference voltage E3 with a decrement of 2 (E3−2=voltage 2) subtracted therefrom is used as the comparison reference voltage E2.

In a bit 1 conversion cycle, if the conversion result in the bit 2 conversion cycle is "10", a sum of the comparison reference voltage D2 and an increment of 1 is used as the comparison reference voltage D1, and the comparison reference voltage D2 with a decrement of 1 subtracted therefrom (D2−1) is used as the comparison reference voltage E1. If the conversion result in the bit 2 conversion cycle is "01", the comparison reference voltage D2 with a decrement of 1 subtracted therefrom (D2−1) is used as the comparison reference voltage D1, and a sum of the comparison reference voltage E2 and an increment of 1 (E2+1) is used as the comparison reference voltage E1. If the conversion result in the bit 2 conversion cycle is "00", a sum of the comparison reference voltage E2 and an increment of 1 (E2+1) is used as the comparison reference voltage D1, and the comparison reference voltage E2 with a decrement of 1 (E2−1) subtracted therefrom is used as the comparison reference voltage E1.

In a bit 0 conversion cycle, if the conversion result in the bit 1 conversion cycle is "10", the comparison reference voltage D1 is used as the comparison reference voltage in the bit 0 conversion cycle. If the conversion result in the bit 1 conversion cycle is "01", the comparison reference voltage D1 with a decrement of 1 subtracted therefrom is used as the comparison reference voltage in the bit 0 conversion cycle. If the conversion result in the bit 1 conversion cycle is "00", the comparison reference voltage E1 is used as the comparison reference voltage in the bit 0 conversion cycle.

A specific description of the comparison operation sequence will be given with reference to an example shown in FIG. 4.

In the bit 3 conversion cycle, voltage 12 is set as the comparison reference voltage D3 and voltage 4 as the comparison reference voltage E3 so that the 1.5-bit comparator 221 compares these voltages with the analog input voltage. In this case, since the analog input voltage is higher in level than the comparison reference voltage D3 and the comparison reference voltage E3, the 1.5-bit comparator 221 outputs a conversion result "10b". The control circuit 222 then latches the conversion result in the bit 3 conversion cycle and outputs, based on the conversion result, the control signal to the DAC 204 so as to set voltage 14 as the comparison reference voltage D2 used in the bit 2 conversion cycle and set voltage 10 as the comparison reference voltage E2.

In the bit 2 conversion cycle, the 1.5-bit comparator 221 compares the two comparison reference voltages thus set with the analog input voltage. In this case, since the analog input voltage is lower in level than the comparison reference voltage D2 and higher than the comparison reference voltage E2, the 1.5-bit comparator 221 outputs a conversion result "01b". The control circuit 222 latches the conversion result in the bit 2 conversion cycle and outputs, based on the conversion result, the control signal to the DAC 204 so as to set voltage 13 as the comparison reference voltage D1 used in the bit 1 conversion cycle and set voltage 11 as the comparison reference voltage E1.

In the bit 1 conversion cycle, the 1.5-bit comparator 221 compares the two comparison reference voltages thus set with the analog input voltage. In this case, since the analog input voltage is lower in level than the comparison reference voltage D1 and higher than the comparison reference voltage E1, the 1.5-bit comparator 221 outputs a conversion result "01b". The control circuit 222 latches the conversion result in the bit 1 conversion cycle and outputs, based on the conversion result, the control signal to the DAC 204 so as to set voltage 12 as the comparison reference voltage used in the bit 0 conversion cycle.

In the bit 0 conversion cycle, one of the three comparators constituting the 1.5-bit comparator 221 is used to compare voltage 12 with the analog input voltage. In this case, since the analog input voltage is higher in level than voltage 12, the 1.5-bit comparator 221 outputs a conversion result "1b". The control circuit 222 latches the conversion result in the bit 0 conversion cycle and completes the entire conversion process. Based on the conversion results in the respective conversion cycles, the control circuit 222 generates a final conversion result which provides for error correction.

The final conversion result, which also provides for error correction, is generated such that the conversion result in the bit 3 conversion cycle is shifted by 2 bits to the left, the conversion result in the bit 2 conversion cycle is shifted by 1 bit to the left so that the conversion results from respective conversion cycles thus shifted are ANDed. The final conversion result "1100b" is thus obtained.

A description will now be given of correction of an error in conversion. FIG. 5 shows a sequence of operations performed by the successive approximation A/D converter according to the second embodiment in a normal operation. FIG. 6 shows a sequence of operations performed by the successive approximation A/D converter according to the second embodiment when an error occurs. Referring to FIGS. 5 and 6, those elements that are identical or equivalent to the corresponding components of FIG. 4 are designated by the same reference numerals and the description thereof is omitted. In order to differentiate between the operation sequences shown in FIGS. 5 and 6, the operation sequence shown in FIG. 5 will be referred to as the operation sequence A and the operation sequence shown in FIG. 6 will be referred to as the operation sequence B.

In the bit 3 conversion cycle, the operation sequence A and the operation sequence B both output the conversion result "01b". In the bit 2 conversion cycle, the operation sequence A outputs the conversion result "01b" as a result of a normal conversion operation. The operation sequence B, however, outputs the conversion result "10b" as a result of failure to properly compare the analog input voltage with the comparison reference voltage D2.

In the bit 1 conversion cycle, the operation sequence A sets voltage 9 as the comparison reference voltage D1 and sets voltage 7 as the comparison reference voltage D1 so as to output the conversion result "10b". The operation sequence B sets voltage 11 as the comparison reference voltage D1 and sets voltage 9 as the comparison reference voltage E1 so as to output the conversion result "01b". In the bit 0 conversion cycle, the operation sequence A sets voltage 9 as the comparison reference voltage so as to output the conversion result "1b". The operation sequence B sets voltage 10 as the comparison reference voltage so as to output the conversion result "0b".

The final conversion result in the operation sequence A shifted and ANDed as described above is "1001b" and the final conversion result in the operation sequence B is also "1001b". This shows that any error occurring during a conversion cycle is corrected in the process of generating the final conversion result. The error correction is effective both when "0" is incorrectly converted into "1" and when "1" is incorrectly converted into "0". Accordingly, flexibility in error correction is increased.

As has been described, according to the second embodiment, the 1.5-bit comparator 221 compares the comparison reference voltages D and E with the analog input voltage so as to output the conversion result "10", "01" or "00" based on the result of comparison. The control circuit 222 outputs the control signal to set the comparison reference voltage D and the comparison reference voltage E to be used in the subsequent conversion cycle, based on the result of comparison. By sifting the 2-bit conversion result obtained by the n-bit output successive approximation A/D converter in the jth conversion cycle (j=1~n−2) n−j−1 bits to the left, and ANDing the conversion results from the respective conversion cycles thus shifted, the final conversion result, which provides for error correction, is generated. Accordingly, a high-precision successive approximation A/D converter is provided. An added advantage provided by the second embodiment in comparison with the first embodiment is that the number of comparators is reduced so that power consumption is reduced.

Third Embodiment

The successive approximation A/D converter according to a third embodiment of the present invention has basically the same construction as the successive approximation A/D converter according to the first embodiment but is different therefrom in that the 2-bit comparator 206 is comprised of only one comparator. More specifically, comparison of the analog input voltage with the three comparison reference voltages in each conversion cycle shown in FIG. 2 is performed by one comparator instead of three comparators.

It is known generally that using a plurality of comparators renders high prevision difficult due to a conversion error caused by offset difference between the comparators. The offset difference between the comparators occurs as a result of variation in transistor characteristics which in turn is caused by variation in processes to which the transistors are subject in a manufacturing process. Variation in threshold levels of the transistors is given by $$\sigma Vth = A*(W*L)^{1/2}$$

where A indicates a coefficient determined by the process, W indicates a transistor width and L indicates a channel length of the transistor.

In the successive approximation A/D converter according to the first embodiment, three comparators are used in each of the conversion cycles. For this reason, a conversion error resulting from a variation in threshold levels of the transistors is likely to occur, thus rendering high precision operation difficult. In contrast, in the successive approximation A/D converter according to the third embodiment, one comparator instead of three comparators is used for three comparison operations in each conversion cycle. Since the entire conversion can be performed by one comparator, a conversion error resulting from a variation in the transistor characteristics is eliminated. The operation sequence according to the third embodiment is the same as that of the first embodiment and the description thereof is omitted.

As has been described, in addition to the advantages of the first embodiment, the third embodiment provides an added advantage of improved precision in analog-to-digital conversion since a conversion error resulting from a variation in the transistor characteristics is eliminated by constructing the 2-bit comparator 206 of one comparator responsible for the entire conversion operations.

Fourth Embodiment

The successive approximation A/D converter according to a fourth embodiment of the present invention has basically the same construction as the successive approximation A/D converter according to the second embodiment shown in FIG. 3 but is different therefrom in that the 1.5-bit comparator 221 is comprised of one converter. More specifically, comparison of the analog input voltage with the two comparison reference voltages in each conversion cycle shown in FIG. 4 is performed by one comparator instead of two comparators. The same advantage as provided by the third embodiment is provided in that a conversion error is eliminated by using one comparator. The operation sequence according to the fourth embodiment is the same as that of the second embodiment and the description thereof is omitted.

As has been described, according to the fourth embodiment, the same advantage as provided by the second embodiment is also available. Moreover, since the 1.5-bit comparator 221 is comprised of one comparator, the entire conversion operations are performed by the one comparator. Accordingly, a conversion error resulting from a variation in the transistor characteristics is eliminated so that the precision in analog-to-digital conversion is improved.

Fifth Embodiment

The successive approximation A/D converter according to a fifth embodiment of the present invention has basically the same construction as the successive approximation A/D converter according to the first embodiment shown in FIG. 1. A difference is that, when the lower bit of the conversion result in a conversion cycle differs from the higher bit of the conversion result in a subsequent conversion cycle, the two conversion cycles from which these two bits are derived are repeated at least once. A re-conversion process is performed upon detection of an error by a re-conversion processing unit (re-conversion means) preferably provided in the control circuit 207.

Figure 7:
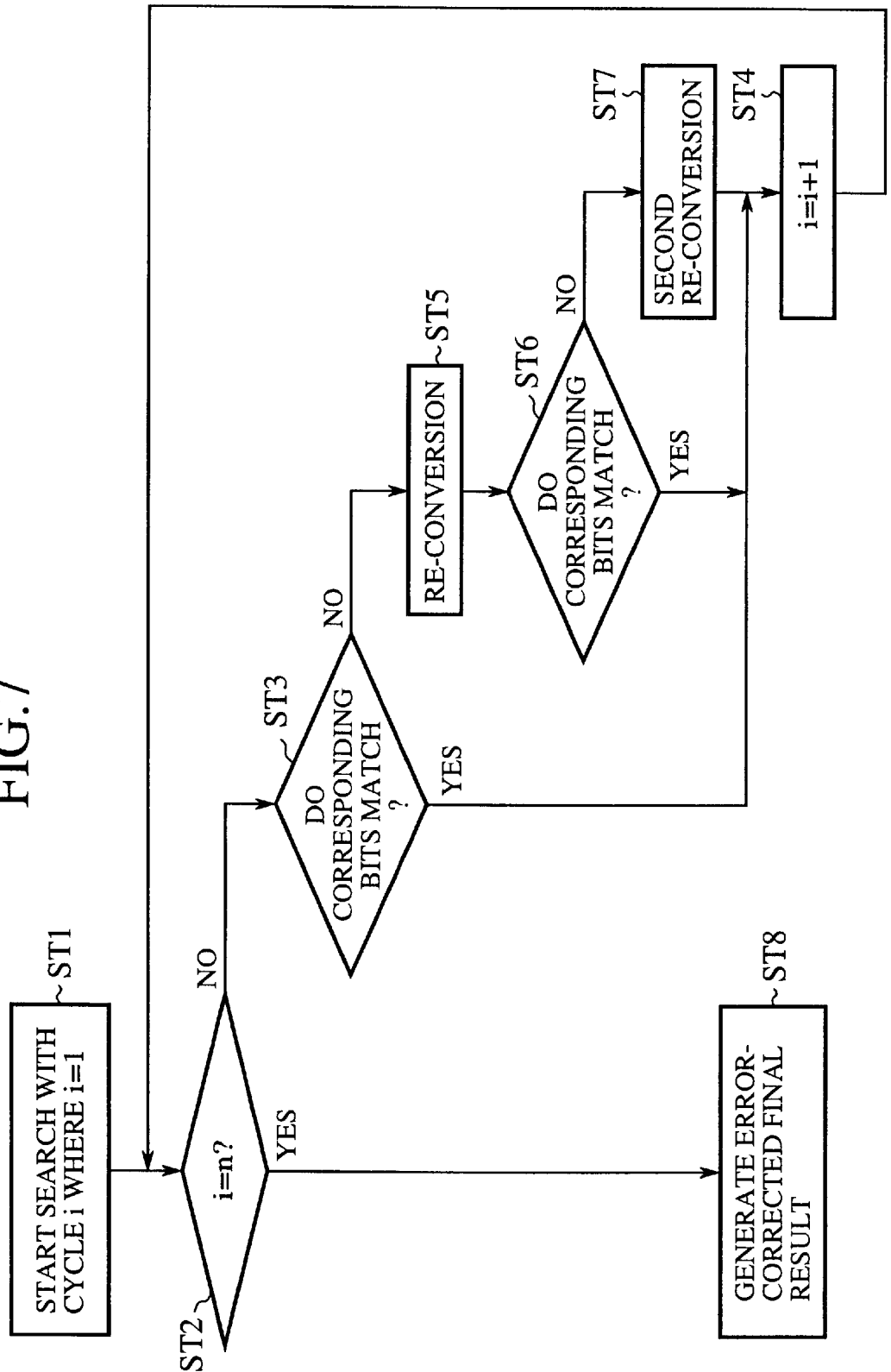
FIG. 7 is a flowchart showing a re-conversion process by a successive approximation A/D converter according to a fifth embodiment of the present invention.

FIG. 7 is a flowchart of the re-conversion process performed by the successive approximation A/D converter according to the fifth embodiment. When the conversion results from the respective conversion cycles are obtained in the n-bit digital conversion of the analog input voltage, a search is started at cycle i where i=1 (step ST1). Subsequently, a determination is made as to whether i=n (step ST2). If i≠n a determination is made as to whether the lower bit of the conversion result in cycle i matches the higher bit of the conversion result in cycle i+1 that follows cycle i (in the case of the last conversion cycle, the only bit of the conversion result) (step ST3). If the corresponding bits match, i is incremented by one (step ST4) so that control is returned to step ST2. If the bits do not match in step ST3, conversions in cycle i and cycle i+1 are repeated (step ST5). After the re-conversion, a determination is made for a second time in step ST6 as to whether the lower bit of the conversion result in cycle i matches the higher bit of the conversion result in cycle i+1 (step ST6). If the corresponding bits match, i is incremented by one (step ST4) so that control is returned to step ST2. If it is found in step ST6 that the corresponding bits do not match, re-conversion is repeated for cycle i and cycle i+1 (step ST7). After repeating the conversion, i is incremented by one (step ST4) so that control is returned to step ST2. If it is determined in step ST2 that i=n, the final conversion result, which also provides for error correction, is generated based on the conversion results from the respective cycles (step ST8).

If the lower bit of the conversion result in cycle i and the higher bit of the conversion result in cycle i+1 do not match even after the re-conversion is repeated, no further conversion is performed. In this case, error correction is performed by ANDing the conversion results in step ST8, the same step as performed in the first embodiment. The fifth embodiment is configured such that error correction is performed after the conversion results from the respective conversion cycles are yielded. However, error correction may be performed before the conversion results are yielded. In an alternative arrangement, re-conversion may be performed only once or more than two times.

As has been described above, according to the fifth embodiment, in addition to the advantages as are available in the first embodiment, provision of the re-conversion processing unit for repeating, at least once, the conversion cycle in which it is likely that a conversion error has occurred ensures that the conversion error is corrected. Accordingly, a successive approximation A/D converter with an improved precision is provided.

Sixth Embodiment

The successive approximation A/D converter according to a sixth embodiment of the present invention has basically the same construction as that of the successive approximation A/D converter according to the first embodiment shown in FIG. 1 and the successive approximation A/D converter according to the second embodiment shown in FIG. 3, a difference being that the final conversion result is validated. Validation of the final conversion result is performed by a conversion result validation processing unit (conversion result validation means) preferably provided in the control circuit 207 and the control circuit 222 (control means).

A description will now be given of a processing algorithm for the conversion result validation. First, a reference voltage is selected to correspond to the final conversion result. For example, if the final conversion result is "1000b", voltage 8 is set as the reference voltage. Second, the 2-bit comparator 206 or the 1.5-bit comparator 222 is used to successively compare the analog input voltage with voltages found in a range centered about the reference voltage thus set. Third, if the comparison result from a comparison with the reference voltage is "1" and the comparison result from a comparison with a voltage higher by one step than the reference voltage is "0", it is determined that the final conversion result is valid. Otherwise, a determination is made that the final conversion result is not valid.

Figures 8, 9:
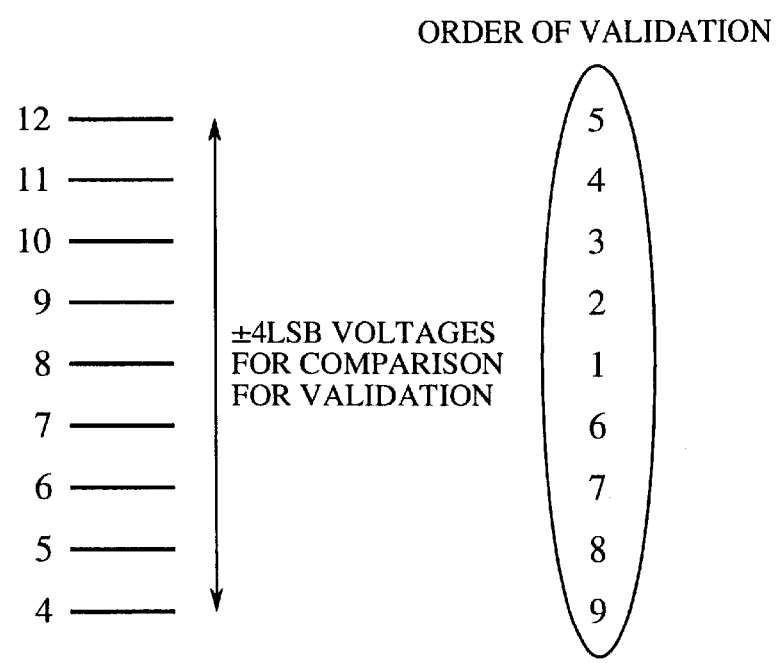
FIG. 8 illustrates a process for validation of a conversion result performed by a successive approximation A/D converter according to a sixth embodiment of the present invention.
FIG. 9 illustrates a sequence of voltages for comparison for validation according to a seventh embodiment of the present invention.

FIG. 8 illustrates a process for validation of a conversion result performed by the successive approximation A/D converter according to the sixth embodiment. As shown in FIG. 8, a range of nine voltage levels including four levels higher than the reference voltage and four levels lower than the reference voltage is set, the interval between the voltage levels being defined by a transition in the least significant bit (LSB). Comparison is made in this range. For example, when the reference voltage is voltage 8, voltages ranging from voltage 4 to voltage 12 are successively compared with the analog input voltage by the comparator. In this embodiment, comparison with voltages 4 through 12 is repeated in the increasing order of voltage levels.

Assuming that the reference voltage is voltage 8, if the comparison result from a comparison with voltage 8 and lower voltages is "1" and the comparison result from a comparison with voltage 9 and higher voltages is "0", as shown in example A of FIG. 8, a determination is made that the final conversion result is valid. When any other comparison result such as that of example B of FIG. 8 is yielded, a determination is made that the final conversion result is not valid. The determination may be externally output to show that a conversion error occurs. Alternatively, the re-conversion may be performed.

The range of voltages is described above as comprising four voltage levels higher than the reference voltage and four voltage levels lower than the reference voltage, the interval between the voltage levels being defined by a transition in the least significant bit (LSB). However, other forms of voltage range are also possible.

The process according to the sixth embodiment is controlled such that, when the range exceeds the level of voltage 15 as a result of setting a high reference voltage, no attempt it made for comparison beyond voltage 15; when the range extends below the level of voltage 0 as a result of setting a low reference voltage, no attempt is made for comparison below voltage 0.

In the description of the sixth embodiment given above, validity of the final conversion result is determined after the comparisons with all of the voltage levels within the range are completed. However, the comparison process may be terminated when it is possible to determine a marginal voltage level that marks between "1" and "0" validation results. Moreover, repetition of comparisons in the increasing order of voltage levels described above may be replaced by comparisons in the decreasing order.

As has been described, according to the sixth embodiment, the conversion result validation processing unit determines the reference voltage corresponding to the digital value given as the final result of comparisons with the analog input voltage. The unit then sets the voltage range centered about the reference voltage. The 2-bit comparator 206 or the 1.5-bit comparator 221 is used to determine by comparison whether the final conversion result is valid. Accordingly, the likelihood of detecting conversion errors is increased so that the precision of the successive approximation A/D converter is increased.

Seventh Embodiment

The successive approximation A/D converter according to a seventh embodiment of the present invention has basically the same construction as the successive approximation A/D converter according to the sixth embodiment, the difference being that the comparison with the analog input voltage for validation is conducted in the increasing order of voltage levels for voltages higher than the reference voltage and in the decreasing order for voltages lower than the reference voltage.

FIG. 9 illustrates a sequence of voltages for comparison for validation according to the seventh embodiment. In the illustrated example, voltage 8 is used as the reference voltage. Four voltage levels higher than the reference voltage and four voltage levels lower than the reference voltage constitute the voltage range as described in the sixth embodiment. The 2-bit comparator 206 or the 1.5-bit comparator 221 successively compares the analog input voltage with voltage 8 through voltage 12 in the increasing order of voltage levels and then compares the analog input voltage with voltage 7 through 4 in the decreasing order of voltage levels. By prescribing the order of comparison as described above, the frequency of comparisons before arriving at a marginal voltage that marks between "0" and "1" validation results produced by the comparator is reduced. This way, speedups of the process of validation of the final conversion results are possible.

As has been described above, according to the seventh embodiment, the conversion result validation processing unit causes the analog input voltage to be compared with voltages in the predetermined range in the increasing order of voltage levels while the voltage for comparison is higher than the reference voltage and in the decreasing order while the voltage for comparison is lower than the reference voltage. As a result of this, the frequency of comparisons before arriving at a marginal voltage that marks between "0" and "1" validation results produced by the comparator is reduced. Accordingly, speedups of the validation of the final conversion result are possible.

Eighth Embodiment

The successive approximation A/D converter according to an eighth embodiment of the present invention has basically the same construction as the successive approximation A/D converter according to the sixth embodiment, the difference being that the comparison starts with the reference voltage and switches between the voltage higher than the reference voltage and the voltage lower than the reference voltage in the order of increasing distance from the reference voltage.

Figure 10:
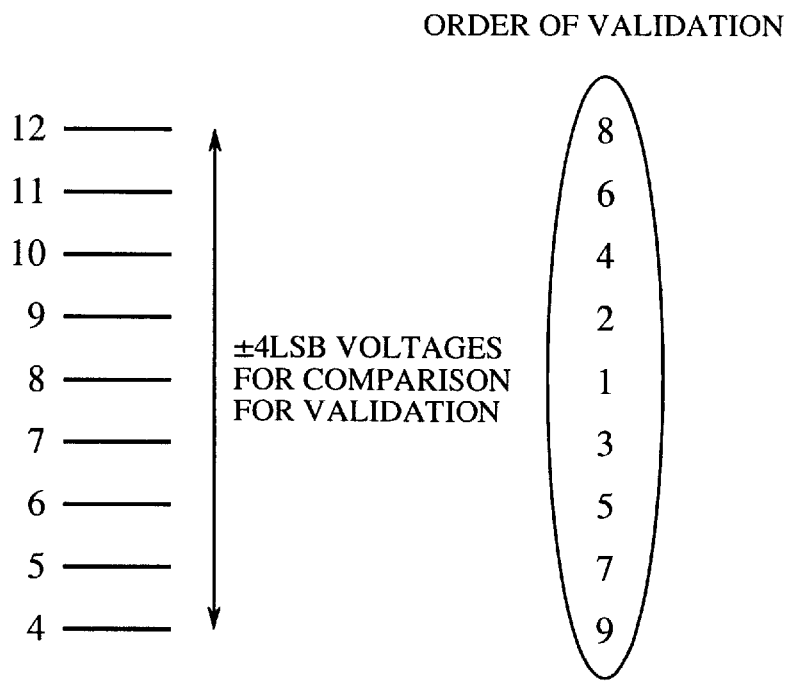
FIG. 10 illustrates a sequence of voltages for comparison for validation according to an eighth embodiment of the present invention.

FIG. 10 illustrates a sequence of voltages for comparison for validation according to an eighth embodiment of the present invention. In the illustrated example, voltage 8 is used as the reference voltage. Four voltage levels higher than the reference voltage and four voltage levels lower than the reference voltage constitute the voltage range as described in the sixth embodiment. The 2-bit comparator 206 or the 1.5-bit comparator 221 first compares the analog input voltage with voltage 8, then proceeding to comparison with voltage 9 higher by 1 level than the reference voltage 8, voltage 7 lower by 1 level than the reference voltage, voltage 10 higher by 2 levels than the reference voltage, and voltage 6 lower by 2 levels than the reference voltage. By prescribing the order of comparison as described above, the frequency of comparisons before arriving at a marginal voltage that marks between "0" and "1" validation results produced by the comparator is reduced. This way, speedups of the process of validation of the final conversion results are possible.

As has been described above, according to the eighth embodiment, the conversion result validation processing unit causes the analog input voltage to be first compared with the reference voltage, then proceeding to comparison with the voltage higher than the reference voltage and the voltage lower than the reference voltage alternatively, in the order of increasing distance from the reference voltage. As a result of this, the frequency of comparisons before arriving at a marginal voltage that marks between "0" and "1" validation results produced by the comparator is reduced. Accordingly, speedups of the validation of the final conversion result are possible.

Ninth Embodiment

The successive approximation A/D converter according to a ninth embodiment of the present invention has basically the same construction as the successive approximation A/D converter according to the sixth embodiment, the difference being that binary search is employed in setting the order of comparison.

Figure 11:
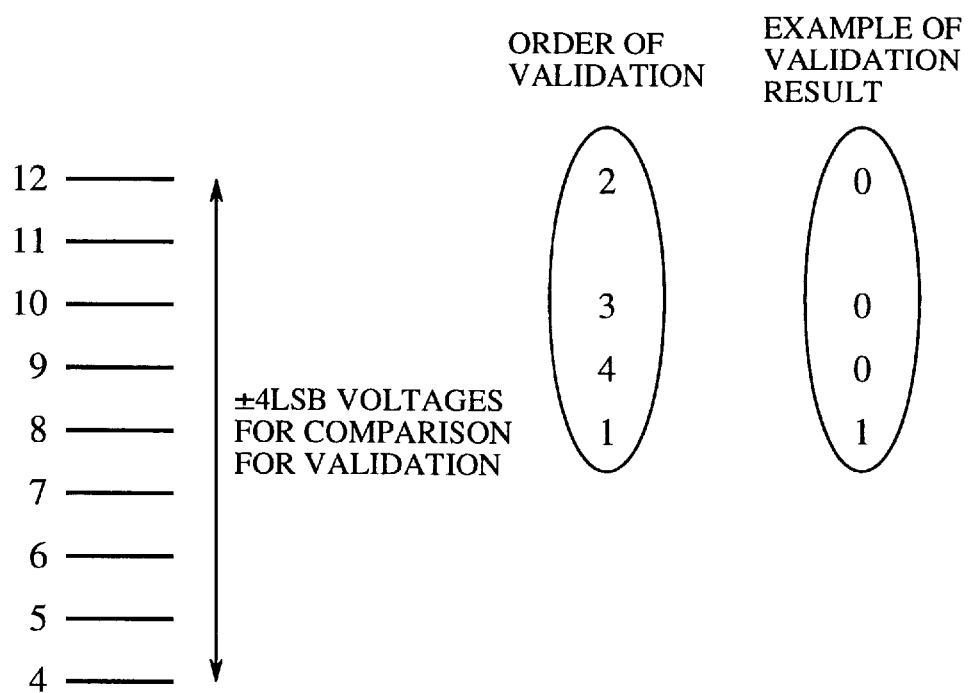
FIG. 11 illustrates a sequence of voltages for comparison for validation according to a ninth embodiment of the present invention.
Figure 12:
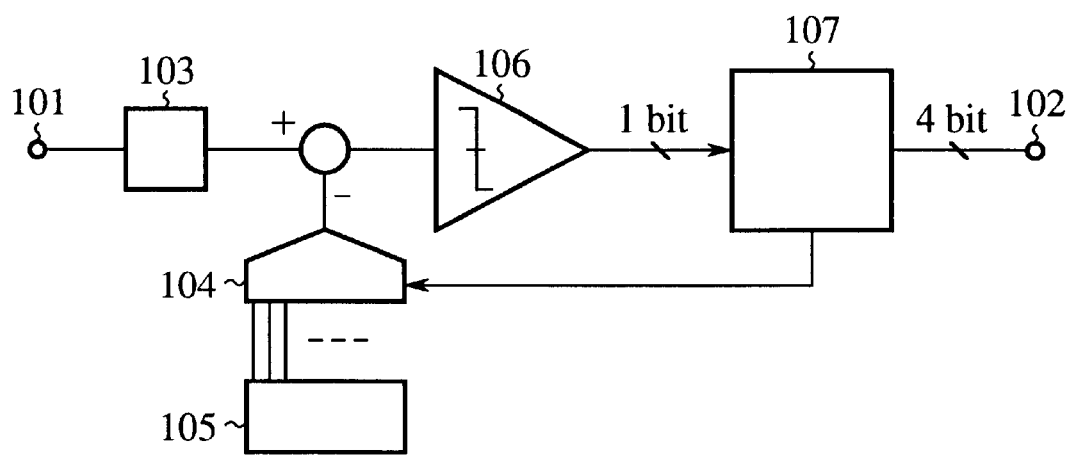
FIG. 12 shows a construction of a successive approximation A/D converter with a 4-bit output according to the related art.
Figure 13:
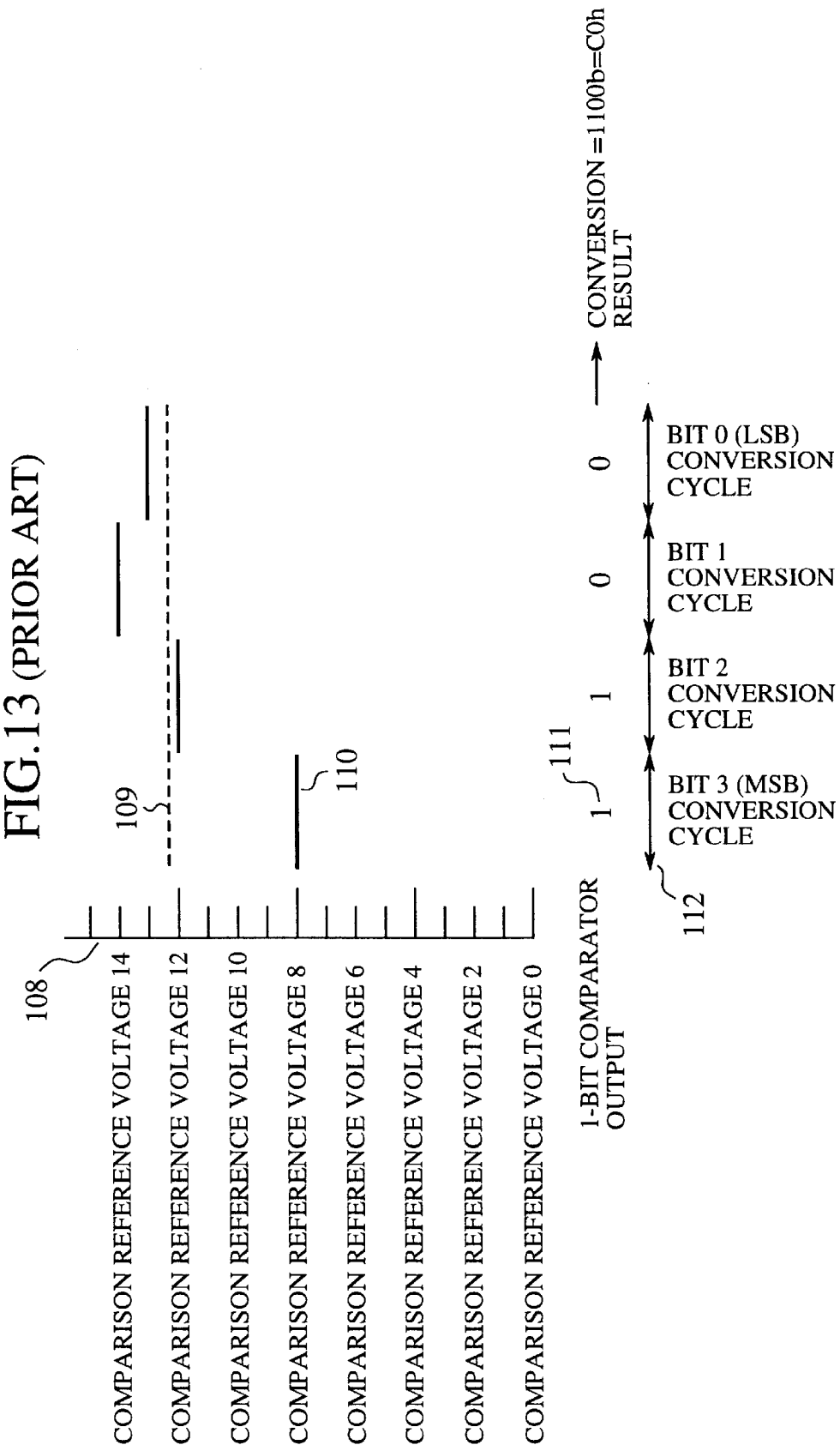
FIG. 13 shows a sequence of operations of the successive approximation A/D converter with a 4-bit output according to the related art.

FIG. 11 illustrates a sequence of voltages for comparison for validation according to a ninth embodiment of the present invention. In the illustrated example, voltage 8 is used as the reference voltage. The voltage range for comparison for validation as described in the sixth embodiment is set to include four voltages higher than the reference voltage and four voltages lower than the reference voltage, as in the sixth embodiment. The voltage subject to comparison with the analog input voltage by the 2-bit comparator 206 or the 1.5-bit comparator 221 is set according to a binary search scheme. Comparison is first made with voltage 8 (reference voltage). If "1" is yielded as a result of the comparison in the first step, voltage 12, voltage 10 and voltage 9 are used in the subsequent comparison in the stated order. If "0" is yielded as a result of the comparison in the first step, voltage 4, voltage 6 and voltage 7 are used in the subsequent comparison. By configuring the order of comparison as described above, it is ensured that a total of four comparisons are invariably required before arriving at a marginal voltage that marks between "0" and "1" of the validation result produced by the comparator. Accordingly, duration of the process of validation is controlled to be constant.

As described above, according to the ninth embodiment, the conversion result validation processing unit employs a binary search scheme to set the voltage subject to comparison with the analog input voltage. The frequency of voltage setting required to arrive at a marginal voltage that marks between "0" and "1" of the validation result produced by the comparator can be fixed. Accordingly, the validation process can be conducted in a fixed period of time.

The present invention is not limited to the above-described embodiments, and variations and modifications may be made without departing from the scope of the present invention.

What is claimed is:

1. A successive approximation A/D converter comprising:
   an analog input terminal;
   a conversion result output terminal;
   voltage holding means connected to said analog input terminal and holding an analog input voltage input via said analog input terminal;
   voltage generating means for generating one or a plurality of voltages that serve as sources for producing comparison reference voltages subject to comparison with said analog input voltage;

comparison reference voltage outputting means connected to said voltage generating means and outputting one or a plurality of comparison reference voltages in accordance with a control signal;

comparing means comprising one or a plurality of comparators and comparing said analog input voltage with the one or the plurality of voltages output by said comparison reference voltage outputting means, so as to output a conversion result comprising at least 2 bits; and control means effecting error correction based on the conversion result output by said comparing means so as to output a final conversion result to said conversion result output terminal.

2. The successive approximation A/D converter according to claim 1, wherein said comparing means compares a first comparison reference voltage, a second comparison reference voltage lower than the first comparison reference voltage, a third comparison reference voltage with the analog input voltage, so as to output the conversion result "11" when the analog input voltage is higher than the first comparison reference voltage, output the conversion result "10" when the analog input voltage is lower than the first comparison reference voltage and higher than the second comparison reference voltage, output the conversion result "01" when the analog input voltage is lower than the second comparison voltage and higher than the third comparison reference voltage, output the conversion result "00" when the analog input voltage is lower than the third comparison reference voltage, output the conversion result "1" when the analog input voltage is higher than the first comparison reference voltage, where the first comparison reference voltage is the only voltage subject to comparison, and output the conversion result "0" when the analog input voltage is lower than the first comparison reference voltage, where the first comparison reference voltage is the only voltage subject to comparison, and wherein said control means processes conversion of the analog input voltage into a n-bit digital value through cycles, where the comparison reference voltage is given in $2^n$ steps, by outputting the control signal to said comparison reference voltage outputting means, thereby a) in a first conversion cycle, setting the first comparison reference voltage at a step $1*2^{n-2}$, setting the second comparison reference voltage at a step $2*2^{n-2}$, setting the third comparison reference voltage at a step $3*2^{n-2}$, b) in an ith conversion cycle, where i=2~n−1, setting the first comparison reference voltage in a previous conversion cycle as the second comparison reference voltage when the conversion result in the previous conversion cycle is one of "11" and "10"; setting the third comparison reference voltage in the previous conversion cycle as the second comparison reference voltage, setting a sum of the second comparison reference voltage in the previous conversion cycle and an increment of $2^{n-i-1}$ in step as the first comparison reference voltage, and setting the second comparison reference voltage with a decrement of $2^{n-i-1}$ in step subtracted therefrom as the third comparison reference voltage, when the conversion result in the previous conversion cycle is one of "01" and "00".

c) in a final nth conversion cycle, setting the first comparison reference voltage in the previous conversion cycle as the first comparison reference voltage, when the conversion result in the previous conversion cycle is one of "11" and "10"; setting the third comparison reference voltage in the previous conversion cycle as the first comparison conversion cycle, when the conversion result in the previous conversion cycle is one of "01" and "00".

3. The successive approximation A/D converter according to claim 2, wherein said comparing means is comprised of one comparator.

4. The successive approximation A/D converter according to claim 1, wherein said comparing means compares a first comparison reference voltage output from said comparison reference voltage outputting means and a second comparison reference voltage lower than the first comparison reference voltage also output from said comparison reference voltage outputting means with the analog input voltage, thereby outputting the conversion-result "10" when the analog input voltage is higher than the first comparison reference voltage, outputting "01" when the analog input voltage is lower than the first comparison reference voltage and higher than the second comparison reference voltage, outputting "00" when the analog input voltage is lower than the second comparison reference voltage, outputting the conversion result "1" when the analog input voltage is higher than the first comparison reference voltage, where the first comparison reference voltage is the only voltage subject to comparison, and outputting "0" when the analog input voltage is lower than the first comparison reference voltage, where the first comparison reference voltage is the only voltage subject to comparison, and wherein said control means processes conversion of the analog input voltage into a n-bit digital value through cycles, where the comparison reference voltage is given in $2^n$ steps, by outputting the control signal to said comparison reference voltage outputting means, thereby a) in a first conversion cycle, setting the first comparison reference voltage at a step $1*2^{n-2}$ and setting the second comparison reference voltage at a step $3*2^{n-2}$, b) in an ith conversion cycle, where i=2~n−1, setting a sum of the first comparison reference voltage in a previous conversion cycle and an increment of $2^{n-i-1}$ in step as the first comparison reference voltage, setting the first comparison reference voltage with a decrement of $2^{n-i-1}$ in step subtracted therefrom as the second comparison reference voltage, when the conversion result in the previous conversion cycle is "10"; setting the first comparison reference voltage in the previous conversion cycle with a decrement of $2^{n-i-1}$ in step subtracted therefrom as the first comparison reference voltage, setting a sum of the second comparison reference voltage in the previous conversion cycle and an increment of $2^{n-i-1}$ in step as the second comparison reference voltage, when the conversion result in the previous conversion cycle is "01"; setting a sum of the second comparison reference voltage in the previous conversion cycle and an increment of $2^{n-i-1}$ in step as the first comparison reference voltage, setting the second comparison reference voltage in the previous conversion cycle with a decrement of $2^{n-i-1}$ in step subtracted therefrom as the second comparison reference voltage, when the conversion result in the previous conversion cycle is "00", c) in a final nth conversion cycle, setting the first comparison reference voltage in the previous conversion cycle as the first comparison reference voltage, when the conversion result in the previous conversion cycle is "10"; setting the first comparison reference voltage in the previous conversion cycle with a decrement of 1 subtracted therefrom as the first comparison conversion cycle, when the conversion result in the previous conversion cycle is "01"; and setting the second comparison reference voltage in the previous conversion cycle as the first comparison reference voltage when the conversion result in the previous conversion cycle is "00".

5. The successive approximation A/D converter according to claim 3, wherein said comparing means is comprised of one comparator.

6. A successive approximation A/D converter comprising:
an analog input terminal;
a conversion result output terminal;
voltage holding means connected to said analog input terminal and holding an analog input voltage input via said analog input terminal;
voltage generating means for generating one or a plurality of voltages that serve as sources for producing comparison reference voltages subject to comparison with said analog input voltage;
comparison reference voltage outputting means connected to said voltage generating means and outputting one or a plurality of comparison reference voltages in accordance with a control signal;
comparing means comprising one or a plurality of comparators and comparing said analog input voltage with the one or the plurality of voltages output by said comparison reference voltage outputting means, so as to output a conversion result comprising at least 2 bits; and
control means effecting error correction based on the conversion result output by said comparing means so as to output a final conversion result to said conversion result output terminal, wherein
said comparing means compares a first comparison reference voltage, a second comparison reference voltage lower than the first comparison reference voltage, a third comparison reference voltage with the analog input voltage, so as to output the conversion result "11" when the analog input voltage is higher than the first comparison reference voltage, output the conversion result "10" when the analog input voltage is lower than the first comparison reference voltage and higher than the second comparison reference voltage, output the conversion result "01" when the analog input voltage is lower than the second comparison voltage and higher than the third comparison reference voltage, output the conversion result "00" when the analog input voltage is lower than the third comparison reference voltage, output the conversion result "1" when the analog input voltage is higher than the first comparison reference voltage, where the first comparison reference voltage is the only voltage subject to comparison, and output the conversion result "0" when the analog input voltage is lower than the first comparison reference voltage, where the first comparison reference voltage is the only voltage subject to comparison, and wherein said control means processes conversion of the analog input voltage into a n-bit digital value through cycles, where the comparison reference voltage is given in $2^n$ steps, by outputting the control signal to said comparison reference voltage outputting means, thereby a) in a first conversion cycle, setting the first comparison reference voltage at a step $1*2^{n-2}$, setting the second comparison reference voltage at a step $2*2^{n-2}$, setting the third comparison reference voltage at a step $3*2^{n-2}$, b) in an ith conversion cycle, where i=2~n−1, setting the first comparison reference voltage in a previous conversion cycle as the second comparison reference voltage when the conversion result in the previous conversion cycle is one of "11" and "10"; setting the third comparison reference voltage in the previous conversion cycle as the second comparison reference voltage, setting a sum of the second comparison reference voltage in the previous conversion cycle and an increment of $2^{n-i-1}$ in step as the first comparison reference voltage, and setting the second comparison reference voltage with a decrement of $2^{n-i-1}$ in step subtracted therefrom as the third comparison reference voltage, when the conversion result in the previous conversion cycle is one of "01" and "00".

c) in a final nth conversion cycle, setting the first comparison reference voltage in the previous conversion cycle as the first comparison reference voltage, when the conversion result in the previous conversion cycle is one of "11" and "10"; setting the third comparison reference voltage in the previous conversion cycle as the first comparison conversion cycle, when the conversion result in the previous conversion cycle is one of "01" and "00", said successive approximation A/D converter further comprising:
re-conversion means whereby, in the ith (i=1~n−2) conversion cycle comprising the cycles for conversion of the analog input voltage into the n-bit digital value, a lower bit from the conversion result of the ith conversion cycle is compared with a higher bit from the conversion result in the conversion cycle subsequent to the ith conversion cycle so that, if the compared bits do not match, each of the ith conversion cycle and the subsequent conversion cycle is repeated at least once, and a lower bit from the conversion result in the n−1th conversion,cycle is compared with a bit from the conversion result in the nth conversion cycle so that, if the compared bits do not mach, each of the n−1th conversion cycle and the nth conversion cycle is repeated at least once.

7. The successive approximation A/D converter according to claim 6, further comprising conversion result validation means for determining a reference voltage corresponding to the digital value representing a final result of conversion, setting a predetermined range of voltages centered about the reference voltage, and determining whether the final result of conversion is valid based on comparison of voltages in the range with the analog input voltage.

8. The successive approximation A/D converter according to claim 6, wherein said conversion result validating means performs comparison in an increasing order of voltage levels for the voltages higher than the reference voltage and then performs comparison in a decreasing order for the voltages lower than the reference voltage.

9. The successive approximation A/D converter according to claim 6, wherein said conversion result validating means first performs comparison using the reference voltage and then alternately uses a higher voltage higher than the reference voltage and a lower voltage lower than the reference voltage in comparison in an increasing order of distance from the reference voltage.

10. The successive approximation A/D converter according to claim 6, wherein said conversion result validating means sets an order of comparing voltages in the range with the analog input voltage, in accordance with a binary search scheme.

* * * * *